United States Patent
Ma et al.

(10) Patent No.: US 6,544,907 B1
(45) Date of Patent: *Apr. 8, 2003

(54) METHOD OF FORMING A HIGH QUALITY GATE OXIDE LAYER HAVING A UNIFORM THICKNESS

(75) Inventors: Yi Ma, Orlando, FL (US); Edith Yang, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 21 days.

This patent is subject to a terminal disclaimer.

(21) Appl. No.: 09/689,030

(22) Filed: Oct. 12, 2000

(51) Int. Cl.[7] .................................................. H01L 21/31
(52) U.S. Cl. ........................ 438/787; 438/765; 438/770; 427/255.6; 427/255.19
(58) Field of Search ................................. 438/239, 769, 438/770, 773, 774, 787, 765; 427/255.6, 255.37, 255.23, 255.19

(56) References Cited

U.S. PATENT DOCUMENTS

| 5,940,736 A | * | 8/1999 | Brady et al. ................. 438/787 |
| 6,027,984 A | | 2/2000 | Thakur et al. |
| 6,184,110 B1 | * | 2/2001 | Ono et al. ................... 438/513 |
| 6,248,618 B1 | * | 6/2001 | Quek et al. ................. 438/199 |
| 6,251,800 B1 | * | 6/2001 | Sun et al. ................... 438/736 |

* cited by examiner

*Primary Examiner*—Caridad Everhart

(57) ABSTRACT

The present invention provides a method for manufacturing a high quality oxide layer having a uniform thickness. The method includes providing a semiconductor substrate, and forming an oxide layer having a substantially uniform thickness on the semiconductor substrate, and in a zone of pressure of less than about 4 Torr or greater than about 25 Torr.

17 Claims, 5 Drawing Sheets

METHOD OF FORMING A HIGH QUALITY GATE OXIDE LAYER HAVING A UNIFORM THICKNESS

TECHNICAL FIELD OF THE INVENTION

The present invention is directed, in general, to integrated circuit fabrication and, more specifically, to a method of forming a gate oxide layer having a substantially uniform thickness.

BACKGROUND OF THE INVENTION

Over the last several decades, the electronics industry has undergone a revolution by the use of semiconductor technology to fabricate small, highly integrated electronic devices. Moreover, a large variety of semiconductor devices having various applicability and numerous disciplines have been manufactured. One such silicon-based semiconductor device that has wide use is a metal-oxide-semiconductor (MOS) transistor.

An important step in the manufacturing of a MOS device is the formation of the gate oxide layer. The quality and uniformity of the gate oxide is critical to the proper operation of any MOS transistor. The gate oxide layer is typically grown in active regions of the device. In order to obtain reliable, high-quality gate oxides, the surface of the active area is often wet-etched to remove any residual oxide. The gate oxide is then grown slowly, typically through a wet oxidation in an oxygen, hydrogen and nitrogen ambient atmosphere or a dry oxidation in an oxygen and nitrogen ambient atmosphere. It is important to carefully control the growth of the gate oxide layer because the thickness and uniformity of the gate oxide layer can significantly impact the overall operation of the device being formed. For example, the drain current in a MOS transistor is inversely proportional to the gate oxide thickness at a given set of terminal voltages. In order to maintain proper transistor operation, which have shrunk well into the submicron range, the thickness of the gate oxide has shrunk in a corresponding fashion to maintain optimal and efficient operation of the transistors. Thus, it is highly desirable to make the gate oxide as thin as possible, taking into consideration the oxide breakdown and reliability considerations of the process and technology being used, while maintaining the robustness and electrical isolation integrity of the gate oxide.

As the overall thickness of the gate oxide layer continues to decrease (e.g., currently it is less than 1.7 nm), the thickness uniformity of the gate oxide layer (e.g., $SiO_2$) becomes ever more critical and at the same time, more problematic. In the past when the gate oxide layer had a thickness of greater than about 10.0 nm, a 0.3 nm variation in gate oxide thickness over the surface of the gate oxide layer amounted to less than a 3 percent variation. However, as mentioned above, gate oxide thicknesses of less than about 1.7 nm are currently being manufactured, and this same 0.3 nm variation in thickness amounts to about a 17 percent variation. Such substantial variations in thickness over the surface of the gate oxide layer are highly undesirable and known to be quite problematic.

To overcome the above mentioned gate dielectric non-uniformity issues, the semiconductor manufacturing industry developed new gate oxide layer manufacturing techniques. Currently, the semiconductor manufacturing industry manufactures gate oxide layers at pressures ranging from about 10 Torr to about 15 Torr. However, forming gate oxides within these pressure ranges produce very non-uniform gate oxides. In previous thicker gate oxide designs this non-uniformity was acceptable as discussed above. But, with the ultra thin gate oxides required by today's semiconductor devices. This non-uniformity is unacceptable because it can decrease the device's overall quality and in some instances can even cause complete failure of the device.

Accordingly, what is needed in the art is a method of manufacturing a highly reliable, ultra thin and reliable oxide layer, that does not experience the problems associated with the prior art methods. The present invention addresses this need.

SUMMARY OF THE INVENTION

To address the above-discussed deficiencies of the prior art, the present invention provides a method for manufacturing a high quality oxide layer having a uniform thickness. In one embodiment, the method includes providing a semiconductor substrate, and forming a gate oxide layer having a substantially uniform thickness on the semiconductor substrate and in a zone of pressure of less than about 4 Torr or greater than about 25 Torr.

It has been unexpectedly found that if the gate oxide layer is formed within these pressure ranges, a substantially uniform gate oxide layer can be formed. Thus, the uniformity problems associated with the prior art methods can be avoided. In fact, the flexibility in processing conditions, including the range of temperatures, range of fluid flows and type of fluid used, may be altered without substantially affecting the quality, thickness or uniformity of the oxide layer.

Another aspect of the invention provides a method of manufacturing an integrated circuit. The method of manufacturing the integrated circuit consists of (1) forming a transistor device over a substrate, including: forming a gate oxide layer having a substantially uniform thickness on the semiconductor substrate and in a zone of pressure of less than about 4 Torr or greater than about 25 Torr, and forming a transistor gate layer over the gate oxide layer, and (2) forming interconnect structures in dielectric layers located over the transistor device, the interconnect structures contacting the transistor device to form a completed integrated circuit.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
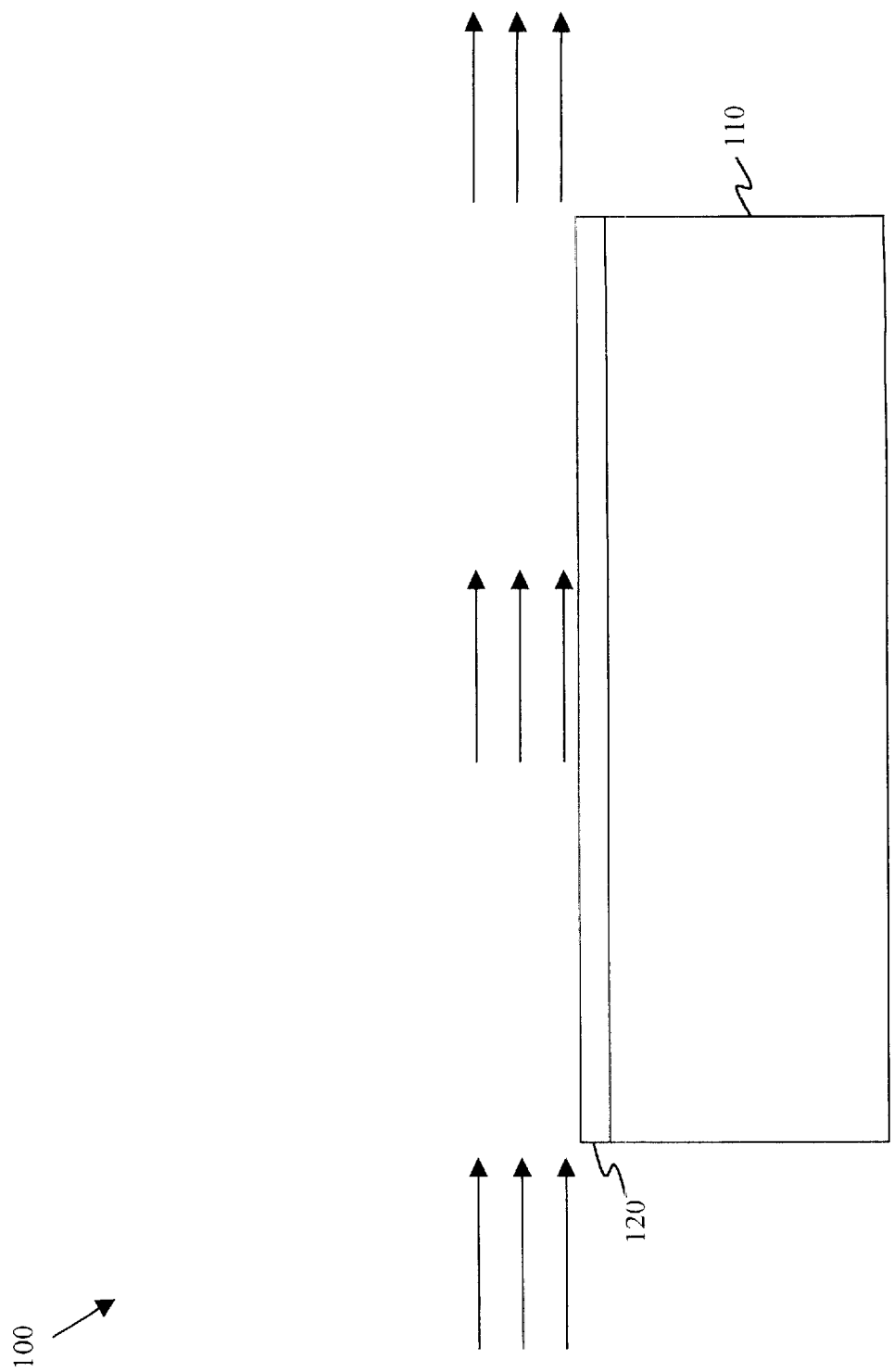
FIG. 1 illustrates a partial sectional view of an exemplary embodiment of a semiconductor feature formed in accordance with the principals of the present invention.

Referring initially to FIG. 1, illustrated is a partial sectional view of an exemplary embodiment of a semiconductor feature 100 formed in accordance with the principals of the present invention. The semiconductor feature 100 includes a semiconductor substrate 110. The semiconductor substrate 110 may be any layer located in the semiconductor feature 100, including a wafer itself or a layer located above the wafer.

Formed over the semiconductor substrate 110 is a high quality gate oxide layer 120. The gate oxide layer 120, as a result of the method covered by the present invention and used to form such a layer, has a substantially uniform thickness. The gate oxide layer 120, in a preferred embodiment, has a thickness of less than about 5.0 nm, and even more preferably, a thickness of less than about 2.0 nm. It should be noted that the gate oxide layer 120 may have a thickness substantially greater than about 5.0 nm, but its use is particularly advantageous in submicron technologies of 0.25 μm or less.

A method for forming the gate oxide layer 120 on the semiconductor substrate 110 will now be discussed. To form the gate oxide layer 120, the semiconductor substrate 110, in an advantageous embodiment is subjected to an oxidation process, typically by placing the semiconductor wafer within a vacuum chamber. In one particular example, the gate oxide layer 120 may be grown using a wet oxidation process, however, in should be noted that the gate oxide layer 120 may also be formed using a dry oxidation process. For example, in one particularly advantageous embodiment, the gate oxide layer 120 may be grown by flowing a mixture of gases, including hydrogen and oxygen, over the semiconductor substrate 110 surface. It should be noted, though, that the present invention is not limited to the oxygen and hydrogen gases, and that other gases, for example nitrogen, may be contained within the mixture. The flow rates of the various gases may vary dramatically, however, an oxygen flow rate ranging from about 0.5 SLM to about 5 SLM, a hydrogen flow rate ranging from about 1.0 sccm to about 2 SLM and a nitrogen flow rate ranging from about 1.0 SLM to about 20 SLM, may be used in one exemplary embodiment. It should be further noted that other similar oxide forming gases may be used in place of those mentioned above, and thus, are also within the scope of the present invention. In a preferred embodiment, the temperature of the mixture ranges from about 700° C. to about 1250° C., but other temperatures mays also be used.

During the formation of the oxide layer 120 the chamber should be maintained at a pressure of less than about 4 Torr or a pressure of greater than about 25 Torr. In another advantageous embodiment, the pressure may be less than about 1 Torr or greater than about 25 Torr. These pressures provide unexpected results over conventional formation pressures; mainly, it has been found that forming the oxide layer 120 within either of these pressure ranges produces a much more uniform oxide layer across the semiconductor substrate than a layer that is formed using the conventional pressures discussed above.

Figure 2:
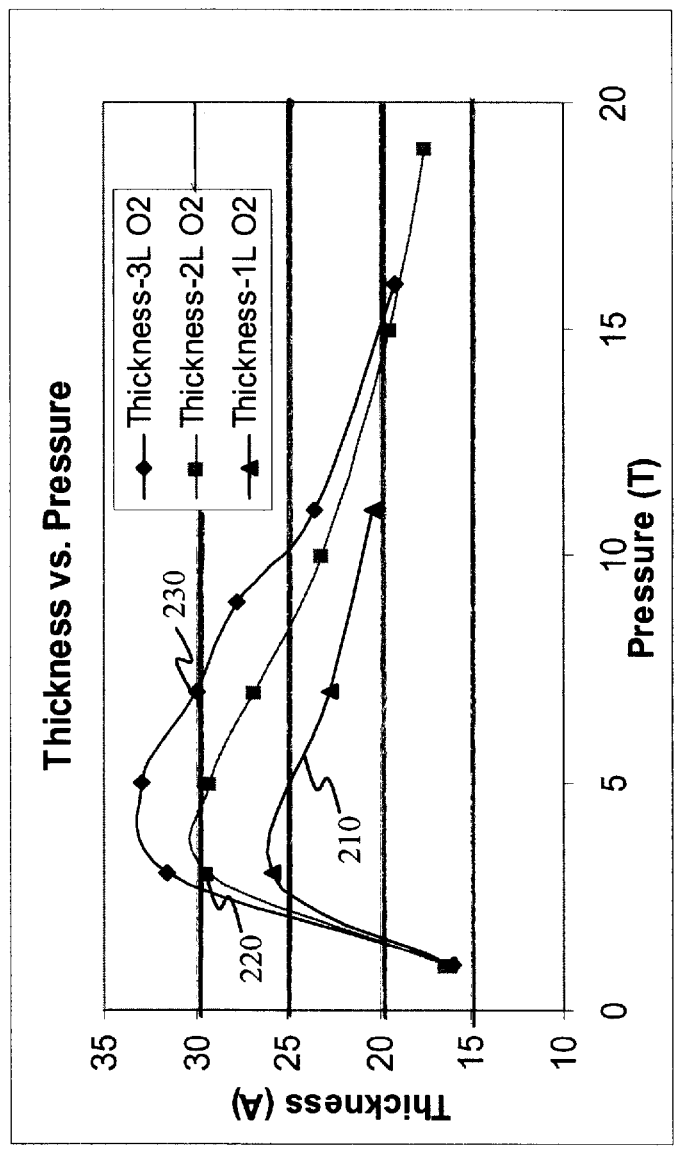
FIG. 2 illustrates a thickness versus pressure profile.
Figure 3:
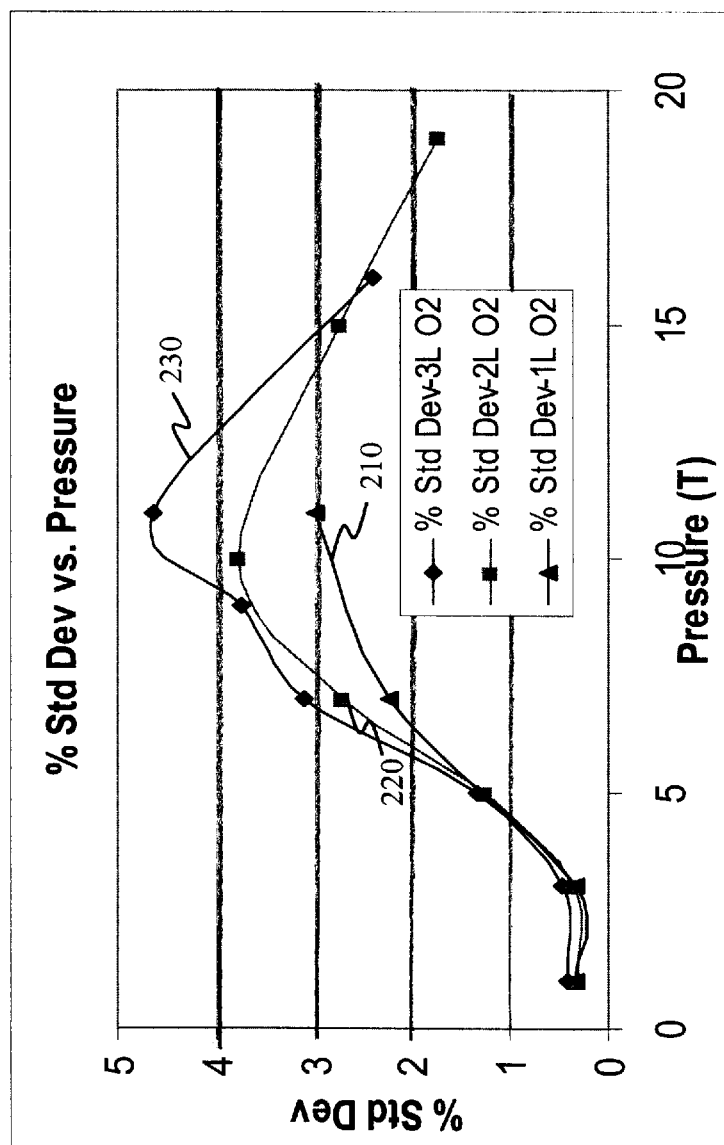
FIG. 3 illustrates a percent standard deviation versus pressure profile.
Figure 4:
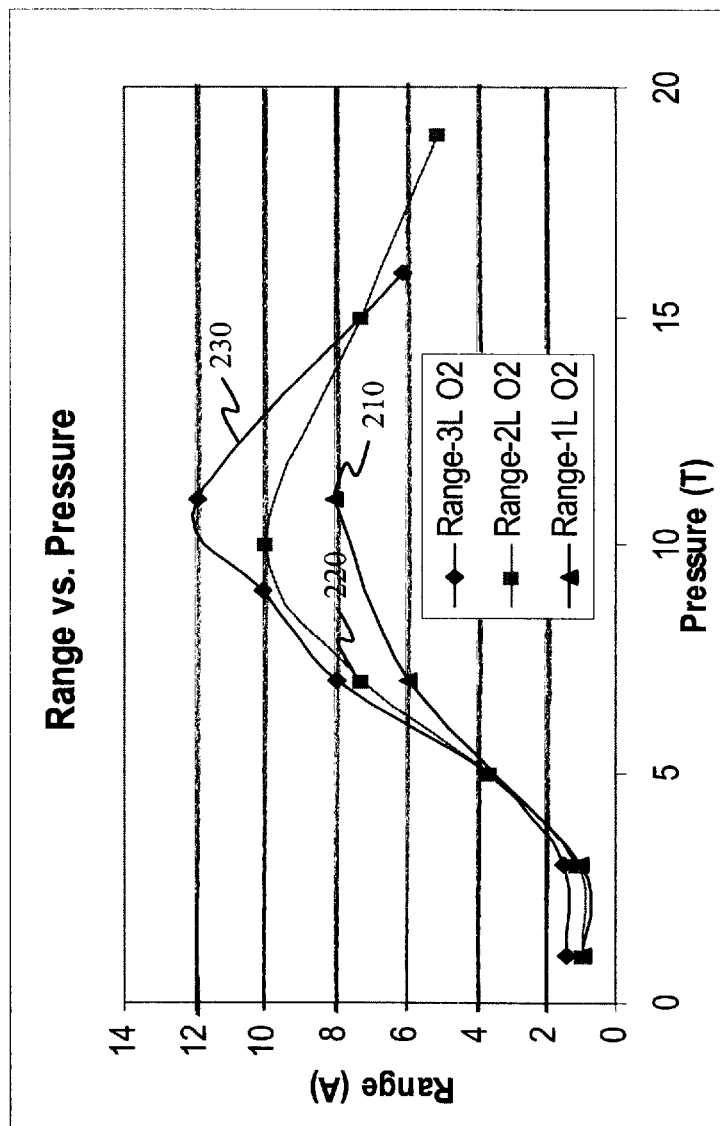
FIG. 4 illustrates range of thickness versus pressure profile.

Turning to FIGS. 2–4, illustrated are graphical representations illustrating the benefits of forming the oxide layer 120 at pressures of less than about 4 Torr, or pressures of greater than about 25 Torr. Traditionally, gate oxides are presently formed at pressures ranging from about 10 Torr to about 18 Torr, and any variation in the processing conditions, including fluid mixture content, fluid mixture temperature and flow rate, caused the surface of the gate oxide to be substantially nonuniform.

FIG. 2 illustrates a thickness versus pressure profile 200 for three different mixtures, each containing differing amounts of oxygen and hydrogen. In the illustrated thickness versus pressure profile 200, it should be understood that the other processing parameters, for example mixture temperature and mixture flow rate, are held constant. A first line 210 represents a gate oxide layer formed using a first mixture, wherein the first mixture comprises 1 liter of oxygen and 0.33 liters of hydrogen. Similarly, a second line 220 represents a gate oxide layer formed using a second mixture, wherein the second mixture comprises 2 liters of oxygen and 0.66 liters of hydrogen. Likewise, a third line 230 represents a gate oxide layer formed using a third mixture, wherein the third mixture comprises 3 liters of oxygen and 0.99 liters of hydrogen.

As can be determined from the thickness versus pressure profile 200 illustrated in FIG. 2, at pressures of less than about 1 Torr, and independent of the variations in mixture content, oxide layers 120 having substantially similar thicknesses are formed. Furthermore, it is believed that the first line 210, second line 220 and third line 230 may be extrapolated and that at a pressure of greater than about 25 Torr, oxide layers 120 having substantially similar thicknesses will also be formed.

In contrast, pressures between about 5 Torr and 18 Torr do not provide substantially similar thicknesses for each of the three examples. For example, it can be observed at a pressure of about 5 Torr, that the thickness of the gate oxide formed with the mixture represented by the first line 210 is about 2.5 nm, the thickness of the gate oxide formed by the mixture represented by the second line 220 is about 2.9 nm, and the thickness of the mixture represented by the third line 230 is about 3.3 nm. What may be understood from the results of the thickness versus pressure profile 200 illustrated in FIG. 2, is that at pressures of less than about 1 Torr and greater than about 25 Torr, the mixture of the forming gas may vary without substantially changing the thickness of the gate oxide layer 120. It should be noted, however, that even though the mixture of the forming gas was varied in the thickness versus pressure profile 200 illustrated in FIG. 2, at pressures of less than about 1 Torr and greater than about 25 Torr, varying the mixture temperature or mixture flow rate would provide substantially the same results, which is indicated by the convergence of the three different sample lines 210, 220, 230.

Turning to FIG. 3, illustrated is a percent standard deviation versus pressure profile 300. This percent standard deviation versus pressure profile 300 illustrates variations in thickness of the gate oxide layer 120, while being formed at the three previously mentioned mixtures and various pressures. Generally, less than a 1 percent standard deviation in thickness across the gate oxide layer 120 is desired. However, even more desirable is a percent standard deviation in thickness across the gate oxide layer 120 of less than about 0.5. As can be seen by the percent standard deviation versus pressure profile 300, at pressures less than about 3 or 4 Torr the percent standard deviation is substantially less than about 1 percent, and more specifically, at about 0.5 percent. It is also believed that if the first line 210, the second line 220 and the third line 230 were extrapolated to a pressure of about 25 Torr, the same would hold true. Thus, at pressures less than about 3 or 4 Torr and greater than about 25 Torr, the percent standard deviation is in the desired range, independent of variations of mixture, mixture temperature and gas flow rate.

In contrast, it can be observed that at pressures ranging from about 5 Torr to about 18 Torr, the percent standard deviation is substantially higher than 1 percent, which as previously mentioned is undesirable. For example, it can be observed at a pressure of about 10 Torr, that the percent standard deviation of the gate oxide formed with the mixture represented by the first line 210 is about 2.8, the percent standard deviation of the gate oxide formed by the mixture represented by the second line 220 is about 3.7, and the percent standard deviation of the mixture represented by the third line 230 is about 4.5. Thus, at pressures such as 10 Torr, not only is the percent standard deviation much higher than 1 percent, but the percent standard deviation varies from about 2.8 to about 4.5 with variations in the fluid mixture. It should be noted, however, that the mixture of the oxidizing agent was varied in the percent standard deviation versus pressure profile 300 illustrated in FIG. 3, but that varying the mixture temperature or mixture flow rate would provide substantially the same results, if using pressures of less than about 3 or 4 Torr and greater than about 25 Torr.

Turning to FIG. 4, illustrated is a range versus pressure profile 400. This range versus pressure profile 400 illustrates the range of thicknesses in angstroms (Å) that may occur for the three given mixtures, at various pressures. As can be seen from the range versus pressure profile 400, at pressures less than about 3 or 4 Torr, and independent of the mixture of gas used to form the gate oxide layer 120, less than about a 2 Å variation in thickness occurs in the gate oxide layer 120. Likewise, it is believed that if the first line 210, second line 220 and third line 230 were extrapolated past about 25 Torr, the same would hold true. Thus, at pressures less than about 3 or 4 Torr and greater than about 25 Torr, the range of thickness within a given gate oxide layer 120 is less than about 2 Å (0.2 nm), independent of variations of mixture, mixture temperature and gas flow rate.

In contrast, it can be observed that at pressures ranging from about 5 Torr to about 18 Torr, the range of thicknesses are substantially higher than 2 Å (0.2 nm), which with the ever decreasing thicknesses of gate oxides, is undesirable. Take for example a pressure of about 10 Torr, wherein the variation in thickness of the gate oxide formed with the mixture represented by the first line 210 is about 7.5 Å (0.75 nm), the variation in thickness of the gate oxide formed by the mixture represented by the second line 220 is about 9.9 Å (0.99 nm), and the variation in thickness of the mixture represented by the third line 230 is about 11.7 Å (1.17 nm). Not only is the range substantially larger than 2 Å, it is not constant for the different fluid mixtures represented by the three lines 210, 220, 230. It should also be noted that the mixture of the forming gas was varied in the range versus pressure profile 400 illustrated in FIG. 4, but that at pressures of less than about 3 or 4 Torr and greater than about 25 Torr, varying the mixture temperature or mixture flow rate would provide substantially the same results.

What may be derived from the three profiles 200, 300, 400, illustrated in FIGS. 2–4, is an optimal range of pressures at which to form the gate oxide layer 120 having a substantially uniform thickness. Moreover, a range of pressures may be determined to provide a wide processing parameter window, wherein changing any processing parameter within the window does not substantially effect the quality, thickness or uniformity of the gate oxide layer 120. From the above-mentioned graphs, it can be seen that a pressure of less than about 4 Torr or a pressure of about 25 Torr, provides such a processing window. These results are quite unexpected in view of the conventional pressures at which gate oxides are typically formed. In an alternative embodiment, a pressure ranging from about 1 mTorr to about 1 Torr or a pressure ranging from about 25 Torr to about 500 Torr, also provides such a processing window. Such pressures also lead to process robustness and much better process repeatability.

Figure 5:
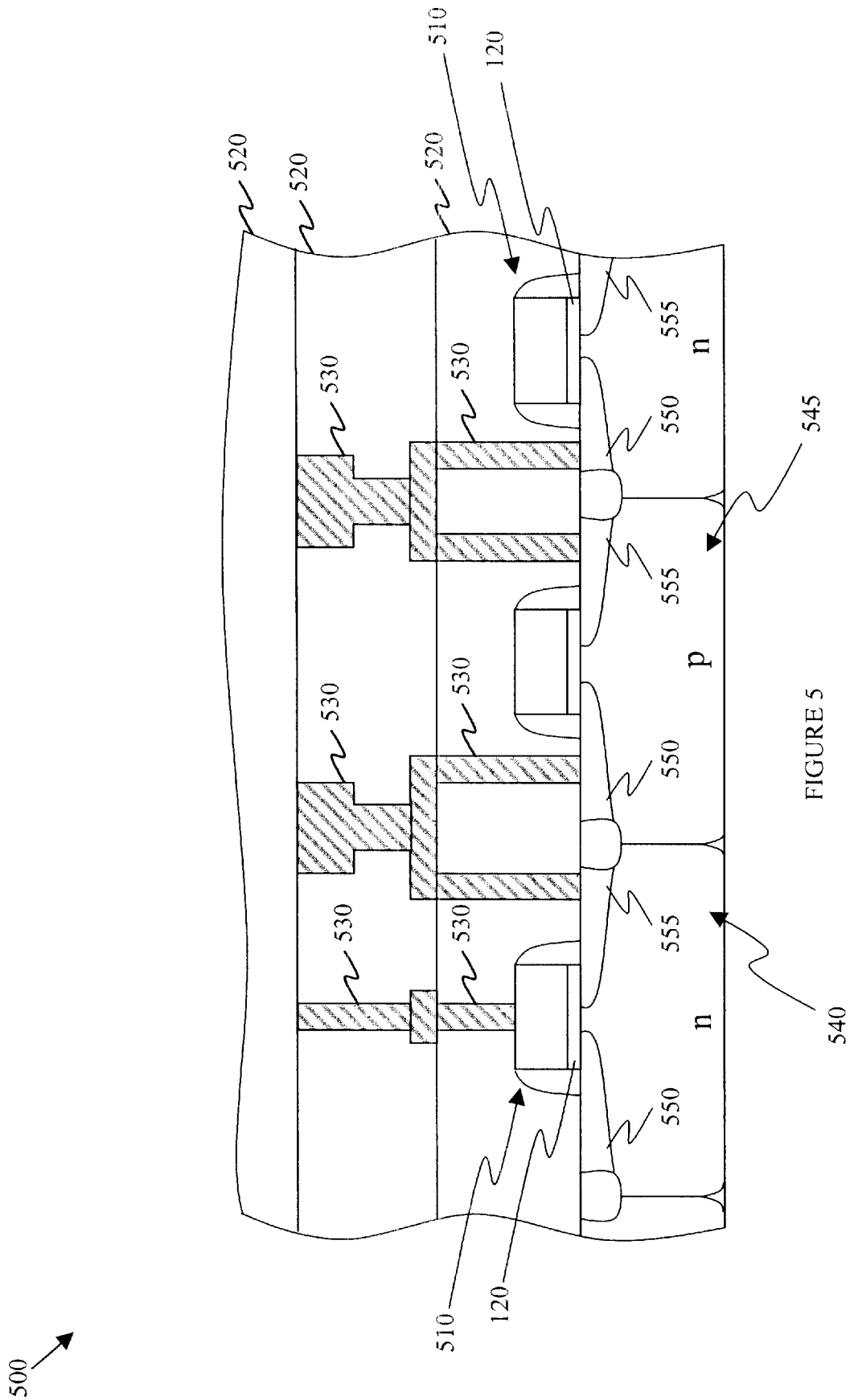
FIG. 5 illustrates a sectional view of a conventional integrated circuit that might be manufactured according to the principles of the present invention.

Turning briefly to FIG. 5, there is illustrated a sectional view of a conventional integrated circuit 500 that might be manufactured according to the principles of the present invention. The integrated circuit 500 may include a CMOS device, a BiCMOS device, a Bipolar device, or other type of integrated circuit device. Shown in FIG. 5 are components of the conventional integrated circuit 500, including: transistors 510, including the gate oxide layer 120, and dielectric layers 520, in which interconnect structures 530 are formed (together forming interconnect layers). In the embodiment shown in FIG. 5, the interconnect structures 530 connect the transistors 510 to other areas of the integrated circuit 500. Also shown in the integrated circuit 500 shown in FIG. 5, are conventionally formed tubs, 540, 545, and source regions 550 and drain regions 555.

Although the present invention has been described in detail, those skilled in the art should understand that they can make various changes, substitutions and alterations herein without departing from the spirit and scope of the invention in its broadest form.

What is claimed is:

1. A method for manufacturing a high quality oxide layer having a uniform thickness, comprising:
   providing a semiconductor substrate; and
   forming a gate oxide layer having a substantially uniform thickness on the semiconductor substrate, the gate oxide layer having a range of thicknesses that varies by less than about 0.2 nm.

2. The method as recited claim 1 wherein forming a gate oxide layer includes growing a gate oxide layer in the presence of oxygen, hydrogen or nitrogen.

3. The method as recited in claim 2 wherein forming a gate oxide layer in the presence of oxygen includes forming a gate oxide layer in the presence of oxygen having a flow rate ranging from about 0.5 SLM to about 5 SLM.

4. The method as recited in claim 2 wherein forming a gate oxide layer in the presence of hydrogen includes forming a gate oxide layer in the presence of hydrogen having a flow rate ranging from about 1.0 sccm to about 2 SLM.

5. The method as recited in claim 2 wherein forming a gate oxide layer in the presence of nitrogen includes forming a gate oxide layer in the presence of nitrogen having a flow rate ranging from about 1.0 SLM to about 20 SLM.

6. The method as recited in claim 1 wherein forming a gate oxide layer includes forming a gate oxide layer at a temperature ranging from about 750° C. to about 1250° C.

7. The method as recited in claim 1 wherein forming a gate oxide layer includes forming a gate oxide layer having a thickness of less than about 5.0 nm.

8. A method of manufacturing an integrated circuit, comprising:
   forming a transistor device over a substrate, including:
      forming a gate oxide layer having a substantially uniform thickness on the semiconductor substrate, the gate oxide layer having a range of thicknesses that varies by less than about 0.2 nm; and forming a transistor gate layer over the gate oxide layer; and forming interconnect structures located over the transistor device, the interconnect structures contacting the transistor device to form a completed integrated circuit.

9. The method as recited in claim 8 wherein forming a gate oxide layer includes growing a gate oxide layer in the presence of oxygen, hydrogen or nitrogen.

10. The method as recited in claim 9 wherein forming a gate oxide layer in the presence of oxygen includes forming a gate oxide layer in the presence of oxygen having a flow rate ranging from about 0.5 SLM to about 5 SLM.

11. The method as recited in claim 9 wherein forming a gate oxide layer in the presence of hydrogen includes forming a gate oxide layer in the presence of hydrogen having a flow rate ranging from about 1.0 sccm to about 2 SLM.

12. The method as recited in claim 9 wherein forming a gate oxide layer in the presence of nitrogen includes forming a gate oxide layer in the presence of nitrogen having a flow rate ranging from about 1.0 SLM to about 20 SLM.

13. The method as recited in claim 8 wherein forming a gate oxide layer includes forming a gate oxide layer at a temperature ranging from about 750° C. to about 1250° C.

14. The method as recited in claim 8 wherein forming a gate oxide layer includes forming a gate oxide layer having a thickness of less than about 5.0 nm.

15. The method as recited in claim 8 wherein the completed integrated circuit includes devices selected from the group consisting of:

CMOS devices,

BiCMOS devices, and

Bipolar devices.

16. A semiconductor device, comprising:

a substrate;

a gate oxide layer located over the substrate and having a thickness of less than about 5 nm and wherein a range of thickness layer varies by less than about 0.2 nm.

17. A semiconductor device, comprising:

a substrate;

a gate oxide layer located over the substrate and having a thickness of less than about 5 nm and that has less than a 1 percent deviation in the thickness across the gate oxide layer.

* * * * *